(12) United States Patent
Liu et al.

(10) Patent No.: US 12,354,555 B2
(45) Date of Patent: Jul. 8, 2025

(54) DISPLAY DEVICE, CONTROLLING METHOD AND APPARATUS, DISPLAY APPARATUS, AND COMPUTER STORAGE MEDIUM

(71) Applicants: Chengdu BOE Optoelectronics Technology Co., Ltd., Sichuan (CN); BOE Technology Group Co., Ltd., Beijing (CN)

(72) Inventors: Lianbin Liu, Beijing (CN); Hengzhen Liang, Beijing (CN); Tingliang Liu, Beijing (CN); Huijuan Yang, Beijing (CN); Jianli Yao, Beijing (CN); Xinpeng Wang, Beijing (CN); Yunhan Xiao, Beijing (CN); Yingjun Deng, Beijing (CN); Qinghu Wei, Beijing (CN); Hang Min, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/282,247

(22) PCT Filed: Nov. 25, 2022

(86) PCT No.: PCT/CN2022/134441
§ 371 (c)(1),
(2) Date: Sep. 15, 2023

(87) PCT Pub. No.: WO2024/108572
PCT Pub. Date: May 30, 2024

(65) Prior Publication Data
US 2025/0037666 A1    Jan. 30, 2025

(51) Int. Cl.
*G09G 3/3266*    (2016.01)
*G09G 3/20*    (2006.01)
(Continued)

(52) U.S. Cl.
CPC ............. *G09G 3/3266* (2013.01); *G09G 3/20* (2013.01); *G09G 3/32* (2013.01); *H10K 59/95* (2023.02);
(Continued)

(58) Field of Classification Search
CPC .... G09G 2310/08; G09G 3/3266; G09G 3/20; G09G 2320/0233; G09G 2310/0221;
(Continued)

(56) References Cited

U.S. PATENT DOCUMENTS 11,238,785 B2 *   2/2022   Kim ................... G09G 3/3275
11,832,455 B2 *   11/2023  Liu ........................ H10K 59/121
(Continued)

FOREIGN PATENT DOCUMENTS

CN    107633807 A    1/2018
CN    108682372 A    10/2018
(Continued)

*Primary Examiner* — Dismery Mercedes
(74) *Attorney, Agent, or Firm* — XSENSUS LLP

(57) ABSTRACT

Provided is a display device. The display device includes a control assembly and a display panel; wherein the display panel includes a display region and drive circuits, wherein the drive circuits include a first drive circuit and a second drive circuit that are respectively disposed on two sides of the display region, and an aperture area is defined in the display region, wherein a distance between the aperture area and the first drive circuit is less than a distance between the aperture area and the second drive circuit; and the control assembly is connected to the display panel, and configured to: determine a target region where the aperture area is located; acquire a display control signal; and control the (Continued)

drive circuits to drive a first target region of the aperture area and a second target region of the aperture area.

18 Claims, 11 Drawing Sheets

(51) Int. Cl.
    *G09G 3/32*     (2016.01)
    *H10K 59/95*     (2023.01)

(52) U.S. Cl.
    CPC ............... *G09G 2300/0408* (2013.01); *G09G 2310/0221* (2013.01); *G09G 2310/08* (2013.01); *G09G 2320/0233* (2013.01); *G09G 2320/0686* (2013.01)

(58) Field of Classification Search
    CPC ....... G09G 2300/0408; G09G 2310/04; G09G 3/3611; G09G 2320/0686; G09G 3/32; G09G 2310/0251
    See application file for complete search history.

(56) References Cited

U.S. PATENT DOCUMENTS

| | | | |
|---|---|---|---|
| 2016/0140895 A1 | 5/2016 | Park et al. | |
| 2016/0247470 A1* | 8/2016 | Tan | G09G 3/3648 |
| 2017/0169796 A1 | 6/2017 | Tai et al. | |
| 2018/0190190 A1* | 7/2018 | Xi | G09G 3/3208 |
| 2018/0322831 A1* | 11/2018 | Kim | G09G 3/3266 |
| 2021/0090490 A1 | 3/2021 | Lee et al. | |
| 2021/0225245 A1* | 7/2021 | Chen | G09G 3/20 |
| 2021/0304663 A1* | 9/2021 | Kim | G09G 3/3275 |
| 2021/0327336 A1 | 10/2021 | Wang et al. | |
| 2021/0376011 A1* | 12/2021 | Liu | H10K 59/353 |
| 2022/0052133 A1 | 2/2022 | Yang et al. | |
| 2022/0139317 A1 | 5/2022 | Lee et al. | |
| 2022/0320199 A1* | 10/2022 | Lee | H10K 59/65 |
| 2023/0093268 A1* | 3/2023 | Chen | G09G 3/32 345/55 |

FOREIGN PATENT DOCUMENTS

| | | |
|---|---|---|
| CN | 110308578 A | 10/2019 |
| CN | 111312074 A | 6/2020 |
| CN | 111489646 A | 8/2020 |
| CN | 111540278 A | 8/2020 |
| CN | 111653576 A | 9/2020 |
| CN | 111952343 A | 11/2020 |
| CN | 113282197 A | 8/2021 |
| CN | 113795925 A | 12/2021 |
| CN | 113838399 A | 12/2021 |
| CN | 114446228 A | 5/2022 |
| CN | 114842746 A | 8/2022 |
| CN | 115360227 A | 11/2022 |
| KR | 2019-0047918 A | 5/2019 |
| WO | 2021/213162 A1 | 10/2021 |

* cited by examiner

DISPLAY DEVICE, CONTROLLING METHOD AND APPARATUS, DISPLAY APPARATUS, AND COMPUTER STORAGE MEDIUM

CROSS-REFERENCE TO RELATED APPLICATION

This application is a U.S. national stage of international application No. PCT/CN2022/134441, filed on Nov. 25, 2022, the disclosure of which is incorporated herein by reference in its entirety.

TECHNICAL FIELD

The present disclosure relates to the field of display technologies, and in particular, relates to a display device, a controlling method and apparatus, a display apparatus, and a computer storage medium.

BACKGROUND

Display devices are devices for achieving the display function. A display region of the display device includes an aperture area capable of transmitting light, such that sensors under the display panel operate normally.

SUMMARY

Embodiments of the present disclosure provide a display device, a controlling method and apparatus, equipment, and a computer storage medium. The technical solutions are as follows.

According to some embodiments of the present disclosure, a display device is provided. The display device includes: a control assembly and a display panel.

The display panel includes a display region and drive circuits, wherein the drive circuits include a first drive circuit and a second drive circuit that are respectively disposed on two sides of the display region, and an aperture area is defined in the display region, wherein a distance between the aperture area and the first drive circuit is less than a distance between the aperture area and the second drive circuit; and the control assembly is connected to the display panel, and configured to:

determine a target region where the aperture area is located, wherein the target region is a part of the display region including the aperture area in a first direction, the first direction being an arrangement direction of the first drive circuit and the second drive circuit;

acquire a display control signal; and control the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased.

In some embodiments, the control assembly is configured to:

control the drive circuits based on the display control signal, such that a strength of a drive signal on the first target region on the first side is greater than a strength of a drive signal on the second target region on the second side.

In some embodiments, the control assembly is configured to:

control the drive circuits based on the display control signal, such that at least one of following conditions is met: the strength of the drive signal on the first target region on the first side being increased, or the strength of the drive signal on the second target region on the second side being decreased.

In some embodiments, the first target region on the first side includes a plurality of first sub-regions, and strengths of drive signals on the plurality of first sub-regions are positively correlated with distances between the plurality of first sub-regions and the first drive circuit; and the second target region on the second side includes a plurality of second sub-regions, and strengths of drive signals on the plurality of second sub-regions are positively correlated with distances between the plurality of second sub-regions and the second drive circuit.

In some embodiments, the control assembly is configured to:

control the drive circuits based on the display control signal, such that an on duration of a drive signal on the first target region on the first side in each period is less than an on duration of a drive signal on the second target region on the second side in each period.

In some embodiments, the control assembly is configured to:

control the drive circuits based on the display control signal, such that at least one of following conditions is met: the on duration of the drive signal on the first target region on the first side being increased, or the on duration of the drive signal on the second target region on the second side being decreased.

In some embodiments, the control assembly is configured to:

control the drive circuits based on the display control signal, such that a strength of a drive signal on the first target region on the first side is greater than a strength of a drive signal on the second target region on the second side, and an on duration of the drive signal on the first target region on the first side in each period is less than an on duration of the drive signal on the second target region on the second side in each period.

In some embodiments, the display panel includes a routine region clock signal line and two target region clock signal lines, and the display region includes a first display region and a second display region that are spaced by the target region, wherein the routine region clock signal line is connected to the first display region and the second display region, and the two target region clock signal lines are connected to the drive circuits on two sides of the target region; and the control assembly is configured to:

control the first target region on the first side and the second target region on the second side based on the display control signal by the two target region clock signal lines, such that an on duration of a drive signal on the first target region on the first side in each period is less than an on duration of a drive signal on the second target region on the second side in each period; and control the first display region and the second display region by the routine region clock signal line.

In some embodiments, a plurality of light-emitting units arranged in columns and rows are disposed in the display region, and a row arrangement direction of the plurality of light-emitting units is parallel to the first direction; wherein the two target region clock signal lines are respectively connected to a drive circuit corresponding to a first row of light-emitting units in the target region and a drive circuit corresponding to a last row of light-emitting units in the target region;

the routine region clock signal line is connected to a drive circuit corresponding to a first row of light-emitting units in the first display region and a drive circuit corresponding to a last row of light-emitting units in the first display region; and the routine region clock signal line is connected to a drive circuit corresponding to a first row of light-emitting units in the second display region and a drive circuit corresponding to a last row of light-emitting units in the second display region.

In some embodiments, the display panel includes a routine region clock signal line and two target region clock signal lines, wherein the routine region clock signal line is connected to drive circuits on two sides of a routine region in the display region other than the target region, and the two target region clock signal lines are connected to the drive circuits on two sides of the target region; and the control assembly is further configured to:

input an initial clock signal to the two target region clock signal lines based on the display control signal, and input an adjust clock signal to at least one of the two target region clock signal lines, wherein the adjust clock signal is superposed with the initial clock signal, such that an on duration of a drive signal on the first target region on the first side in each period is less than an on duration of a drive signal on the second target region on the second side in each period; and control the routine region by the routine region clock signal line.

In some embodiments, a plurality of light-emitting units arranged in columns and rows are disposed in the display region, and a row arrangement direction of the plurality of light-emitting units is parallel to the first direction; wherein the two target region clock signal lines are respectively connected to a drive circuit corresponding to a first row of light-emitting units in the target region and a drive circuit corresponding to a last row of light-emitting units in the target region; and the routine region clock signal line is connected to a drive circuit corresponding to a first row of light-emitting units in the routine region and a drive circuit corresponding to a last row of light-emitting units in the routine region.

In some embodiments, the control assembly is configured to:

acquire aperture mark parameters, wherein the aperture mark parameters record a start position and an end position of the aperture area in a second region, the second direction being a direction perpendicular to the first direction; and determine the target region where the aperture area is located based on the aperture mark parameters.

According to some embodiments of the present disclosure, a method for controlling a display panel is provided. The method is applicable to the display panel. The display panel includes a display region and drive circuits, wherein the drive circuits include a first drive circuit and a second drive circuit that are respectively disposed on two sides of the display region, and an aperture area is defined in the display region, wherein a distance between the aperture area and the first drive circuit is less than a distance between the aperture area and the second drive circuit; and the method includes:

determining a target region where the aperture area is located, wherein the target region is a part of the display region including the aperture area in a first direction, the first direction being an arrangement direction of the first drive circuit and the second drive circuit;

acquiring a display control signal; and controlling the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased.

In some embodiments, controlling the drive circuits based on the display control signal to drive, in response to the different drive signals, the first target region on the first side, proximal to the first drive circuit, of the aperture area and the second target region on the second side, proximal to the second drive circuit, of the aperture area includes:

controlling the drive circuits based on the display control signal, such that a strength of a drive signal on the first target region on the first side is greater than a strength of a drive signal on the second target region on the second side.

In some embodiments, controlling the drive circuits based on the display control signal, such that the strength of the drive signal on the first target region on the first side is greater than the strength of the drive signal on the second target region on the second side includes:

controlling the drive circuits based on the display control signal, such that at least one of following conditions is met: the strength of the drive signal on the first target region on the first side being increased, or the strength of the drive signal on the second target region on the second side being decreased.

In some embodiments, the first target region on the first side includes a plurality of first sub-regions, and strengths of drive signals on the plurality of first sub-regions are positively correlated with distances between the plurality of first sub-regions and the first drive circuit; and the second target region on the second side includes a plurality of second sub-regions, and strengths of drive signals on the plurality of second sub-regions are positively correlated with distances between the plurality of second sub-regions and the second drive circuit.

In some embodiments, controlling the drive circuits based on the display control signal to drive, in response to the different drive signals, the first target region on the first side, proximal to the first drive circuit, of the aperture area and the second target region on the second side, proximal to the second drive circuit, of the aperture area includes:

controlling the drive circuits based on the display control signal, such that an on duration of a drive signal on the first target region on the first side in each period is less than an on duration of a drive signal on the second target region on the second side in each period.

In some embodiments, controlling the drive circuits based on the display control signal, such that the on duration of the drive signal on the first target region on the first side in each period is less than the on duration of the drive signal on the second target region on the second side in each period includes:
  controlling the drive circuits based on the display control signal, such that at least one of following conditions is met: the on duration of the drive signal on the first target region on the first side being increased, or the on duration of the drive signal on the second target region on the second side being decreased.

In some embodiments, controlling the drive circuits based on the display control signal to drive, in response to the different drive signals, the first target region on the first side, proximal to the first drive circuit, of the aperture area and the second target region on the second side, proximal to the second drive circuit, of the aperture area includes:
  controlling the drive circuits based on the display control signal, such that a strength of a drive signal on the first target region on the first side is greater than a strength of a drive signal on the second target region on the second side, and an on duration of the drive signal on the first target region on the first side in each period is less than an on duration of the drive signal on the second target region on the second side in each period.

In some embodiments, the display panel includes a routine region clock signal line and two target region clock signal lines, and the display region includes a first display region and a second display region that are spaced by the target region, wherein the routine region clock signal line is connected to the first display region and the second display region, and the two target region clock signal lines are connected to the drive circuits on two sides of the target region; and
  controlling the drive circuits based on the display control signal to drive, in response to the different drive signals, the first target region on the first side, proximal to the first drive circuit, of the aperture area and the second target region on the second side, proximal to the second drive circuit, of the aperture area includes:
  controlling the first target region on the first side and the second target region on the second side based on the display control signal by the two target region clock signal lines, such that an on duration of a drive signal on the first target region on the first side in each period is less than an on duration of a drive signal on the second target region on the second side in each period, and
  controlling the first display region and the second display region by the routine region clock signal line.

In some embodiments, a plurality of light-emitting units arranged in columns and rows are disposed in the display region, and a row arrangement direction of the plurality of light-emitting units is parallel to the first direction; wherein
  the two target region clock signal lines are respectively connected to a drive circuit corresponding to a first row of light-emitting units in the target region and a drive circuit corresponding to a last row of light-emitting units in the target region;
  the routine region clock signal line is connected to a drive circuit corresponding to a first row of light-emitting units in the first display region and a drive circuit corresponding to a last row of light-emitting units in the first display region; and
  the routine region clock signal line is connected to a drive circuit corresponding to a first row of light-emitting units in the second display region and a drive circuit corresponding to a last row of light-emitting units in the second display region.

In some embodiments, the display panel includes a routine region clock signal line and two target region clock signal lines, wherein the routine region clock signal line is connected to drive circuits on two sides of a routine region in the display region other than the target region, and the two target region clock signal lines are connected to the drive circuits on two sides of the target region; and
  controlling the drive circuits based on the display control signal to drive, in response to the different drive signals, the first target region on the first side, proximal to the first drive circuit, of the aperture area and the second target region on the second side, proximal to the second drive circuit, of the aperture area includes:
  inputting an initial clock signal to the two target region clock signal lines based on the display control signal, and inputting an adjust clock signal to at least one of the two target region clock signal lines, wherein the adjust clock signal is superposed with the initial clock signal, such that an on duration of a drive signal on the first target region on the first side in each period is less than an on duration of a drive signal on the second target region on the second side in each period; and
  controlling the routine region by the routine region clock signal line.

In some embodiments, a plurality of light-emitting units arranged in columns and rows are disposed in the display region, and a row arrangement direction of the plurality of light-emitting units is parallel to the first direction; wherein
  the two target region clock signal lines are respectively connected to a drive circuit corresponding to a first row of light-emitting units in the target region and a drive circuit corresponding to a last row of light-emitting units in the target region; and
  the routine region clock signal line is connected to a drive circuit corresponding to a first row of light-emitting units in the routine region and a drive circuit corresponding to a last row of light-emitting units in the routine region.

In some embodiments, determining the target region where the aperture area is located includes:
  acquiring aperture mark parameters, wherein the aperture mark parameters record a start position and an end position of the aperture area in a second region, the second direction being a direction perpendicular to the first direction; and
  determining the target region where the aperture area is located based on the aperture mark parameters.

According to some embodiments of the present disclosure, a display apparatus is provided. The display apparatus includes: a processor, a memory storing at least one instruction, at least one program, a code set, or an instruction set therein, and a display panel; wherein the processor, when loading and executing the at least one instruction, the at least one program, the code set, or the instruction set, is caused to perform the above method for controlling the display panel.

According to some embodiments of the present disclosure, a non-transitory computer storage medium is provided. The computer storage medium stores at least one instruction, at least one program, a code set, or an instruction set, wherein the at least one instruction, the at least one program, the code set, or the instruction set, when loaded and executed by a processor, causes the processor to perform the above method for controlling the display panel.

According to some embodiments of the present disclosure, a computer program product or computer program is provided. The computer program product or computer program includes one or more computer instructions stored in a computer-readable storage medium. The one or more computer instructions, when loaded and executed by a processor of the computer device from the computer-readable storage medium, cause the processor to perform the above method for controlling the display panel.

BRIEF DESCRIPTION OF DRAWINGS

For clearer description of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without any creative efforts.

Exemplary embodiments of the present disclosure are shown by the above accompanying drawings, and more detailed descriptions are shown hereinafter. The accompanying drawings and texts are not intended to limit the scope of the concept of the present disclosure in any way, but to describe the concept of the present disclosure for those skilled in the art with reference to specific embodiments.

DETAILED DESCRIPTION

To make the objectives, technical solutions, and advantages of the present disclosure clearer, the embodiments of the present disclosure are further described in detail hereinafter with reference to the accompanying drawings.

Typically, a display device includes a display panel and a control assembly. The display panel includes drive circuits on two sides of a display region, the control assembly is connected to the display panel and configured to control the drive circuits on two sides of the display region to drive the display region for achieving the display function.

At present, for improvement of the screen-to-body of various terminals, the aperture area is disposed in the display panel of the terminal, various sensors (for example, a visible light sensor, an infrared sensor, a depth sensor, and the like) are disposed on a bottom side of the aperture area (the bottom side of the aperture area refers to a side, facing towards an inner of the terminal, of the display panel), and information on a front of the display panel is acquired by an aperture. The aperture on the display panel is a region capable of transmitting the light, light-emitting units are not disposed in the region, and a transparent line is disposed to connect light-emitting units on two sides of the aperture.

However, in the case that distances between the aperture area and the drive circuits on two sides of the display region are different, luminance of the display regions on two sides of the aperture area is different due to different loads of two sides of the aperture area, such that the display effect of the display device is poor.

Figure 1:
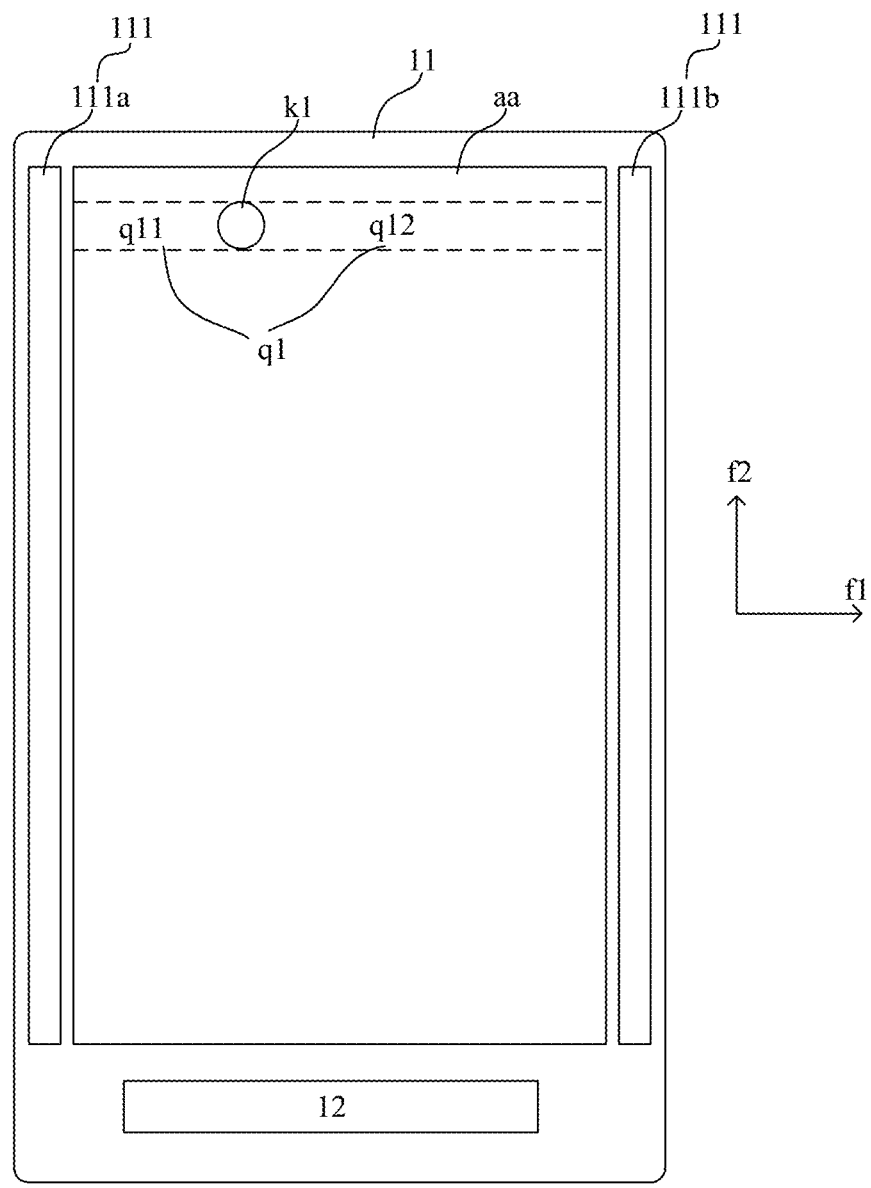
FIG. 1 is a schematic structural diagram of a display device according to some embodiments of the present disclosure.

FIG. 1 is a schematic structural diagram of a display device according to some embodiments of the present disclosure. As shown in FIG. 1, the display device 10 includes a display panel 11 and a control assembly 12. The display panel 11 includes a display region aa and drive circuits 111. The drive circuits 111 include a first drive circuit 111a and a second drive circuit 111b that are respectively disposed on two sides of the display region, and an aperture area k1 is defined in the display region aa. A distance between the aperture area k1 and the first drive circuit 111a is less than a distance between the aperture area k1 and the second drive circuit 111b.

The control assembly 12 is connected to the display panel 11, and configured to:
  determine a target region q1 where the aperture area k1 is located, wherein the target region q1 is a part of the display region aa including the aperture area k1 in a first direction f1, and the first direction f1 is an arrangement direction of the first drive circuit 111a and the second drive circuit 111b;
  acquire a display control signal; and
  control the drive circuits 111 based on the display control signal to drive, in response to different drive signals, a first target region q11 on a first side, proximal to the first drive circuit 111a, of the aperture area k1 and a second target region q12 on a second side, proximal to the second drive circuit 111b, of the aperture area k1, such that a luminance difference between the first target region on the first side and the second target region on the second side is decreased.

In summary, in the display device in the embodiments of the present disclosure, by controlling drive circuits by a control assembly, the drive circuits drive, in response to different drive signals, a first target region on a first side, proximal to a first drive circuit, of the aperture area and a second target region on a second side, proximal to the second drive circuit, of the aperture area, such that a luminance difference between the first target region on the first side and the second target region on the second side is decreased. As such, in the case that the aperture area is offset, the drive signals on two sides of the aperture area are different, such that the display effect of the display device is improved.

The drive circuits 111 are gate on array (GOA) drive circuits. The control assembly 12 is connected to the drive circuits 111 to control the drive circuits 111.

The control assembly includes a drive integrated circuit (DIC). Regions in the display region aa other than the aperture area k1 include a plurality of light-emitting units (the light-emitting units may be organic light-emitting diodes) arranged in columns and rows to achieve the display function under the driving of the drive circuits 111. The aperture area k1 is not disposed with the light-emitting units (in some embodiments, the aperture area k1 is disposed with the light-emitting units, which is not limited in the embodiments of the present disclosure), and lines on two sides of the aperture area k1 are connected by winding the lines in the aperture area.

However, in the case that the distances between the aperture area k1 and the drive circuits 111 on two sides are different (that is, the aperture area is offset), in the target region q1 where the aperture area k1 is located, the loads of data lines in the region q11 and the region q12 on two sides of the aperture area k1 are different due to wire winding in the aperture area. In the driving method in some practices, the region q11 and the region q12 on two sides of the aperture area are driven based on the same drive signal (the drive signal is a GOA signal), such that the luminance in the region q11 and the luminance in the region q12 are different. Illustratively, the luminance in the region q11 on the shorter side is greater than the luminance in the region q12 on the longer side, and the phenomenon is referred to as the hole mura, which causes the poor display effect of the display panel. The embodiments of the present disclosure provide a method and apparatus for controlling a display panel, a display apparatus, and a computer storage medium, which solve the problem.

The display device in the embodiments of the present disclosure includes various devices with the display function, for example, a smart mobile phone, a tablet computer, a smart wearable device, a computer display screen, a stereo display screen, and an outdoor display screen, which is not limited in the embodiments of the present disclosure.

In addition, the aperture area shown in FIG. 1 is in a circle shape, and the aperture area may also be in a rectangle, rhombus, or pentagon shape, or in other shapes, which is not limited in the embodiments of the present disclosure.

Figure 2:
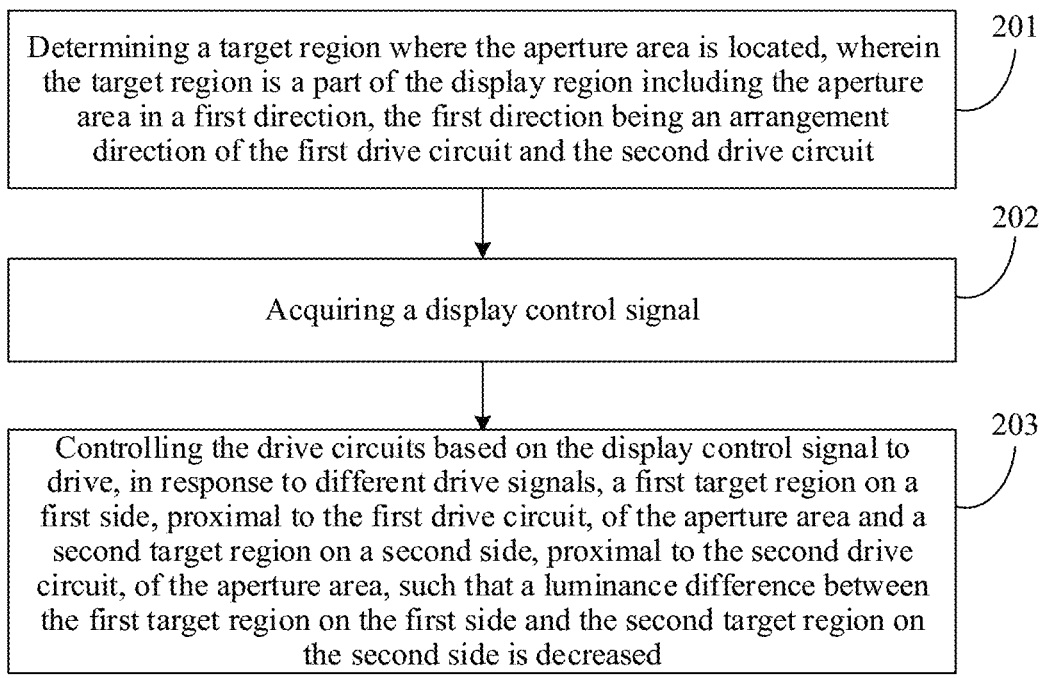
FIG. 2 is a flowchart of a method for controlling a display panel according to some embodiments of the present disclosure.

FIG. 2 is a flowchart of a method for controlling a display panel according to some embodiments of the present disclosure. The method is applicable to the control assembly of the display panel. The method includes the following processes.

In S201, a target region where the aperture area is located is determined, wherein the target region is a part of the display region including the aperture area in a first direction, and the first direction is an arrangement direction of the first drive circuit and the second drive circuit.

In S202, a display control signal is acquired.

In S203, the drive circuits are controlled based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased.

Figure 3:
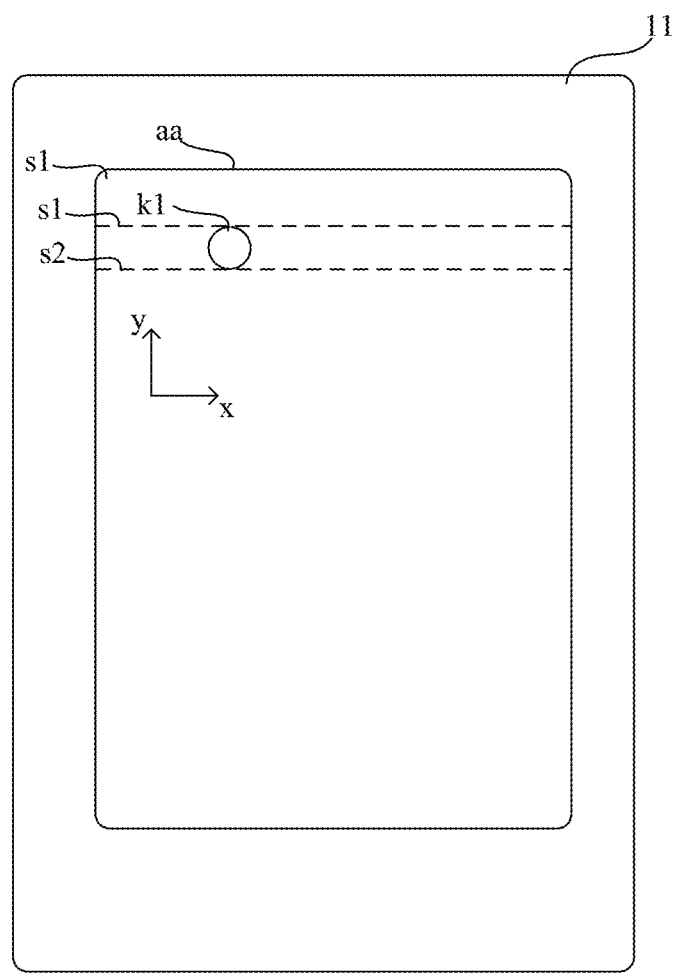
FIG. 3 is a schematic diagram of a target region according to some embodiments of the present disclosure.

The region including the aperture area in the first direction refers to a region overlapped with the aperture area in the first region. Illustratively, as shown in FIG. 3, FIG. 3 is a schematic diagram of a target region according to some embodiments of the present disclosure. A coordinate system is established in the display region aa. The x-axis is parallel to the first direction f1, the y-axis is perpendicular to the first direction f1, and the target region is a region enclosed by two straight lines s1 and s2 and a bezel of the display region aa. The two straight lines s1 and s2 travel through two extreme points in a y-axis direction and are parallel to the x-axis.

In summary, in the method for controlling the display panel in the embodiments of the present disclosure, by controlling drive circuits by a control assembly, the drive circuits drive, in response to different drive signals, a first target region on a first side, proximal to a first drive circuit, of the aperture area and a second target region on a second side, proximal to the second drive circuit, of the aperture area, such that a luminance difference between the first target region on the first side and the second target region on the second side is decreased. As such, in the case that the aperture area is offset, the drive signals on two sides of the aperture area are different, such that the display effect of the display panel is improved.

Figure 4:
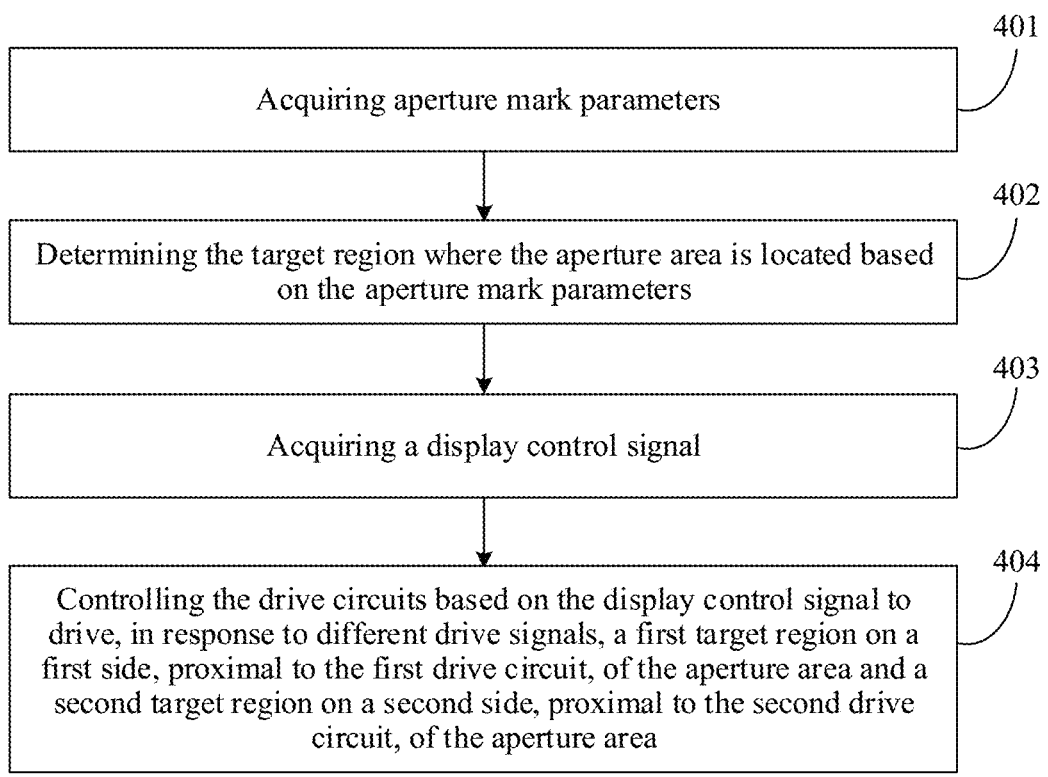
FIG. 4 is a flowchart of another method for controlling a display panel according to some embodiments of the present disclosure.

FIG. 4 is a flowchart of another method for controlling a display panel according to some embodiments of the present disclosure. The method is applicable to the control assembly of the display panel shown in FIG. 1. The method for controlling the display panel includes the following processes.

In S401, aperture mark parameters are acquired.

In the method in the embodiments of the present disclosure, the control assembly first acquires the aperture mark parameters. Referring to FIG. 1, the aperture mark parameters record a start position and an end position of the aperture area k1 in a second region f2, and the second direction f2 is a direction perpendicular to the first direction f1.

Illustratively, the aperture mark parameters include offset values, and the offset values are stored in a register. For example, a 6-bit register is disposed to store the start position of the aperture area, and the control assembly acquires the aperture mark parameters from the register. The register is shown in Table 1.

TABLE 1

| hole_Before_offset(0:5) | | | | | | |
|---|---|---|---|---|---|---|
| A0 | B5 | B4 | B3 | B2 | B1 | B0 |

A0 represents an address of the register, B5, B4, B3, B2, B1, and B0 are stored start positions of the aperture area. Illustratively, as shown in FIG. 1, the start positions include that the aperture is in a first row in the left side and a first row in the right side.

Similarly, a 6-bit register is disposed to store the end position of the aperture area. The register is shown in Table 2.

TABLE 2

| hole_END_offset(0:5) | | | | | | |
|---|---|---|---|---|---|---|
| A1 | E5 | E4 | E3 | E2 | E1 | E0 |

A1 represents an address of the register, E5, E4, E3, E2, E1, and E0 are stored end positions of the aperture area. Illustratively, as shown in FIG. 1, the end positions include that the aperture is in a last row in the left side and a last row in the right side.

It should be noted that position information of the aperture area is acquired based on a design drawing of the display panel, and the aperture mark parameters are stored in the display device based on the position information.

In S402, the target region where the aperture area is located is determined based on the aperture mark parameters.

Upon acquiring the aperture mark parameters, the control assembly determines the target region where the aperture area is located based on the aperture mark parameters.

In S403, a display control signal is acquired.

The display control signal is a signal for controlling the display panel to display, and is generated based on an external signal (for example, an image signal) by the control assembly or directly generated by the control assembly.

In S404, the drive circuits are controlled based on the display control signal to drive, in response to different drive signals, a first target region on a first side, proximal to the first drive circuit, of the aperture area and a second target region on a second side, proximal to the second drive circuit, of the aperture area.

In the embodiments of the present disclosure, upon determining the target region where the aperture area is located and acquiring the display control signal, the control assembly drives the display panel. The different drive signals are used to decrease the luminance difference of two sides of the aperture area.

It should be noted that in some practices, the drive signals in the display regions on two sides of the aperture area in the target region are the same. However, the luminance in the display regions on two sides of the aperture area are different as the aperture, and the luminance in the display region on the shorter side is greater than the luminance in the display region on the longer side. On this basis, the drive signal on the display regions on two sides of the aperture area in the target region are changed to increase the luminance in the display region on the longer side or decrease the luminance in the display region on the shorter side, such that the luminance difference between the display regions on two sides of the aperture area is decreased, and the display effect of the display panel is improved. In detail, the drive signal on the first target region on the first side and the drive signal on the second target region on the second side are determined by simulation or experiments, such that the luminance difference between the first target region on the first side and the second target region on the second side is decreased. Illustratively, the luminance in the first target region on the first side and the luminance in the second target region on the second side are the same.

In the embodiments of the present disclosure, the target region and other regions in the display region than the target region are driven by the control assembly in different manners.

In some embodiment, the control assembly controls the drive circuits to drive, in response to different drive signals, the first target region on the first side, proximal to the first drive circuit, of the aperture area and the second target region on the second side, proximal to the second drive circuit, of the aperture area in various manners. Illustratively, the manners are specifically as follows.

(1) The drive circuits are controlled based on the display control signal, such that a strength of a drive signal on the first target region on the first side is greater than a strength of a drive signal on the second target region on the second side.

In this manner, the control assembly controls the drive signal on the first target region on the first side to be greater than the drive signal on the second target region on the second side, such that the difference between the luminance in the first target region on the first side and the luminance in the second target region on the second side is decreased. In detail, the control assembly controls the drive circuits based on the display control signal, such that the drive signal on the first target region on the first side is increased, and/or the drive signal on the second target region on the second side is decreased, and the strength of the drive signal on the first target region on the first side is greater than the strength of the drive signal on the second target region on the second side. In some embodiments, the strength of the drive signal is a magnitude of a current of the drive signal.

Figure 5:
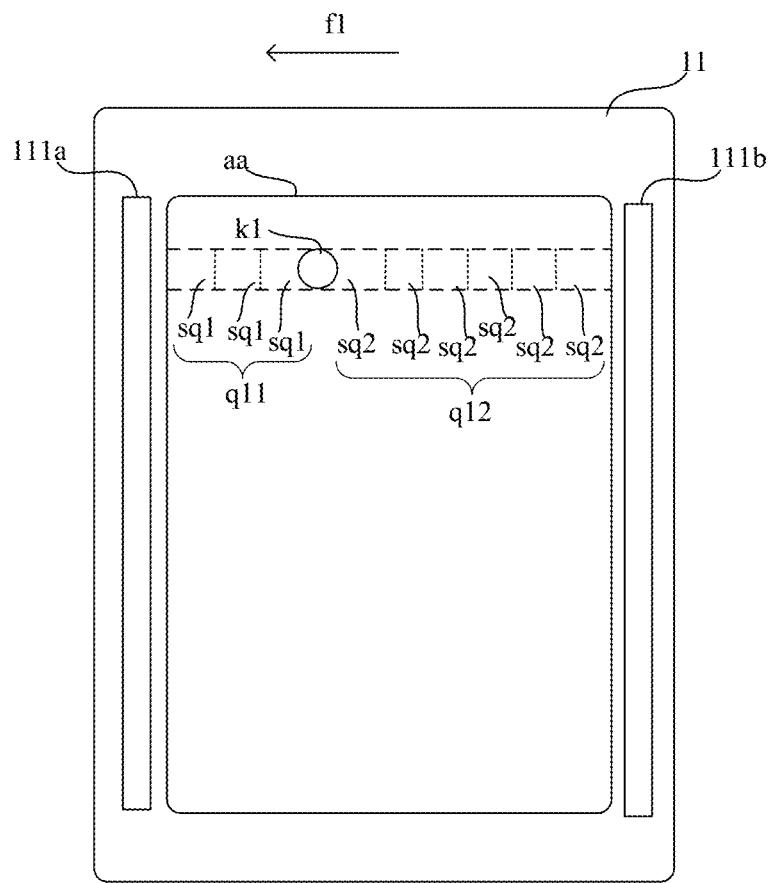
FIG. 5 is a schematic diagram of a display region according to some embodiments of the present disclosure.

In some embodiments, as shown in FIG. 5, FIG. 5 is a schematic diagram of a display region according to some embodiments of the present disclosure. The first target region q11 on the first side includes a plurality of first sub-regions sq1, and strengths of drive signals on the plurality of first sub-regions sq1 are positively correlated with distances between the plurality of first sub-regions sq1 and the first drive circuit 111a. That is, in the plurality of first sub-regions sq1, the greater the distance between the first sub-region sq1 and the first drive circuit 111a, the greater the strength of the drive signal on the first sub-region sq1. The greater the distance between the first sub-region sq1 and the first drive circuit 111a, the greater the effect of the load of the date line on the drive signal. Thus, the effect of the load of the date line is decreased in this manner. The distance between the first sub-region sq1 and the first drive circuit 111a refers to a distance in the first direction f1.

The second target region q12 on the second side includes a plurality of second sub-regions sq2, and strengths of drive signals on the plurality of second sub-regions sq2 are positively correlated with distances between the plurality of second sub-regions sq2 and the second drive circuit 111b. That is, in the plurality of second sub-regions sq2, the greater the distance between the second sub-region sq2 and the second drive circuit 111b, the greater the strength of the drive signal on the second sub-region sq2. The distance between the second sub-region sq2 and the second drive circuit 111b refers to a distance in the first direction f1.

In addition, in some embodiments, a strength of a drive signal on a first sub-region sq1 with a maximum distance with the first drive circuit 111a is less than a strength of a drive signal on a second sub-region sq2 with a minimum distance with the second drive circuit 111b. That is, the strengths of the drive signals on the first sub-regions sq1 are less than the strengths of the drive signals on the second sub-regions sq2.

In some embodiments, the strengths of the drive signals are set as a plurality of levels (for example, 16 levels), and the plurality of levels of the drive signals are assigned to the target regions on two sides of the aperture area. For example, a plurality of first sub-regions sq1 in the target region q11 on the shorter side in the first direction are assigned with lower levels, and a plurality of second sub-regions sq2 in the target region q12 on the longer side in the first direction are assigned with higher levels. A highest level of the first sub-region sq1 is less than a lowest level of the second sub-region sq2.

(2) The drive circuits are controlled based on the display control signal, such that an on duration of a drive signal on the first target region on the first side in each period is less than an on duration of a drive signal on the second target region on the second side in each period.

In this manner, the difference between the luminance in the first target region on the first side and the luminance in the second target region on the second side is decreased by controlling the on duration of the drive signal. In this manner, the control assembly controls the drive circuits based on the display control signal, such that the on duration of the drive signal on the first target region on the first side is decreased, and/or the on duration of the drive signal on the second target region on the second side is decreased.

Figure 6:
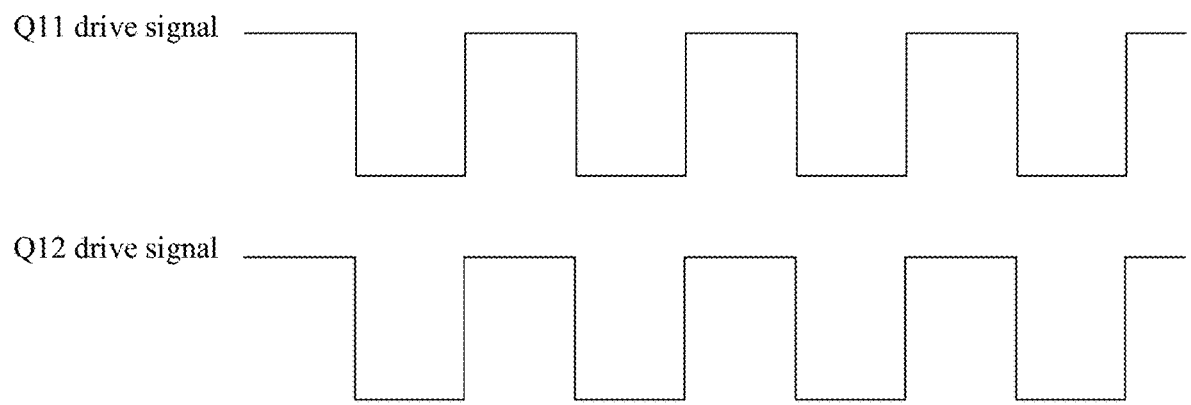
FIG. 6 is a schematic diagram of drive signals on a first target region on a first side and a second target region on a second side in some practices.

Referring to FIG. 6, FIG. 6 is a schematic diagram of drive signals on a first target region on a first side and a second target region on a second side in some practices. The on duration of the drive signal on the first target region q11 on the first side in each period is the same as the on duration of the drive signal on the second target region q12 on the second side in each period, such that the luminance in the first target region on the first side is different from the luminance in the second target region on the second side.

Figure 7:
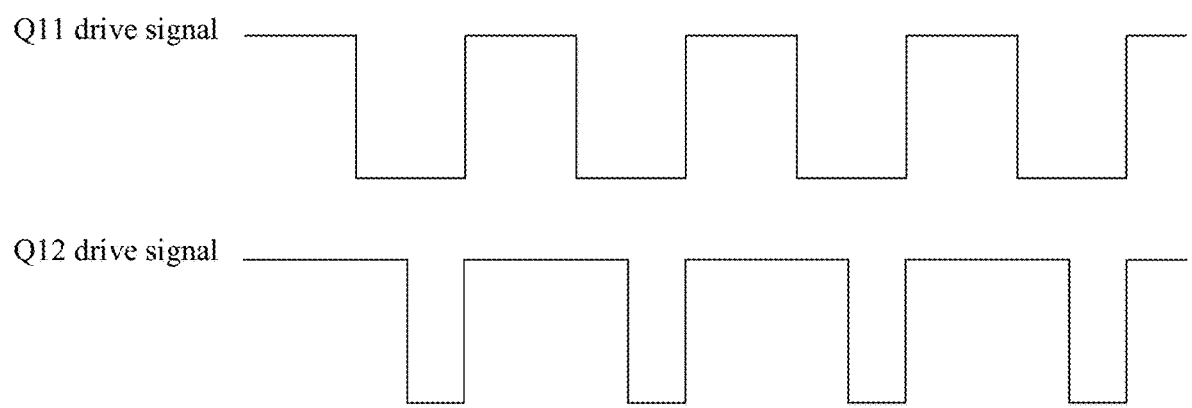
FIG. 7 is a schematic diagram of drive signals on a first target region on a first side and a second target region on a second side according to some embodiments of the present disclosure.

Referring to FIG. 7, FIG. 7 is a schematic diagram of drive signals on a first target region on a first side and a second target region on a second side according to some embodiments of the present disclosure. The on duration of the drive signal on the first target region q11 on the first side in each period is less than the on duration of the drive signal on the second target region q12 on the second side in each period, such that the difference between the luminance in the first target region on the first side and the luminance in the second target region on the second side is decreased. The drive signal is on in the case that the drive signal is in a high level, the drive signal is off in the case that the drive signal is in a low level, and one on state and one off state are a period.

(3) The drive circuits are controlled based on the display control signal, such that a strength of a drive signal on the first target region on the first side is greater than a strength of a drive signal on the second target region on the second side, and an on duration of the drive signal on the first target region on the first side in each period is less than an on duration of the drive signal on the second target region on the second side in each period.

The above descriptions in parts (1) and (2) provide two manners of controlling the drive signal, and the above manners in parts (1) and (2) are also simultaneously used in the embodiments of the present disclosure, that is, the manner described in part (3). The detailed manners of adjusting the strength of the drive signal and the on duration of the drive signal in each period are referred to the above descriptions in parts (1) and (2), which is not repeated in the embodiments of the present disclosure.

It should be noted that in the case that the control assembly decreases the difference between the luminance in the first target region on the first side and the luminance in the second target region on the second side by adjusting the strength of the drive signal and the on duration of the drive signal in each period, the adjustment degrees of the strength of the drive signal and the on duration of the drive signal in each period are reduced to avoid the adverse effect of the excessive adjustment of the strength of the drive signal and the on duration of the drive signal, and the adjustment effect of the method in the embodiments of the present disclosure on the severe hole mura is improved, such that the severe hole mura is solved by the method in the embodiments of the present disclosure.

In addition, in the method in the embodiments of the present disclosure, the driving method for other regions in the display region than the target region may be not adjusted, that is, the control assembly controls other regions than the target region by the method in some practices, which is not limited in the embodiments of the present disclosure.

In summary, in the method for controlling the display panel in the embodiments of the present disclosure, by controlling drive circuits by a control assembly, the drive circuits drive, in response to different drive signals, a first target region on a first side, proximal to a first drive circuit, of the aperture area and a second target region on a second side, proximal to the second drive circuit, of the aperture area, such that a luminance difference between the first target region on the first side and the second target region on the second side is decreased. As such, in the case that the aperture area is offset, the drive signals on two sides of the aperture area are different, such that the display effect of the display panel is improved.

In addition, a display device is further provided in the embodiments of the present disclosure. The display device is acquired by adjusting the display device shown in FIG. 1. In the display device, the control assembly is configured to:
    control the drive circuits based on the display control signal, such that a strength of a drive signal on the first target region on the first side is greater than a strength of a drive signal on the second target region on the second side.

In some embodiments, the control assembly is configured to:
    control the drive circuits based on the display control signal, such that the strength of the drive signal on the first target region on the first side is increased, and/or the strength of the drive signal on the second target region on the second side is decreased.

In some embodiments, the first target region on the first side includes a plurality of first sub-regions, and strengths of drive signals on the plurality of first sub-regions are positively correlated with distances between the plurality of first sub-regions and the first drive circuit; and
    the second target region on the second side includes a plurality of second sub-regions, and strengths of drive signals on the plurality of second sub-regions are positively correlated with distances between the plurality of second sub-regions and the second drive circuit.

In some embodiments, the control assembly is configured to:
    control the drive circuits based on the display control signal, such that an on duration of a drive signal on the first target region on the first side in each period is less than an on duration of a drive signal on the second target region on the second side in each period.

In some embodiments, the control assembly is configured to:
    control the drive circuits based on the display control signal, such that the on duration of the drive signal on the first target region on the first side is increased, and/or the on duration of the drive signal on the second target region on the second side is decreased.

In some embodiments, the control assembly is configured to:
    control the drive circuits based on the display control signal, such that a strength of a drive signal on the first target region on the first side is greater than a strength of a drive signal on the second target region on the second side, and an on duration of the drive signal on the first target region on the first side in each period is less than an on duration of the drive signal on the second target region on the second side in each period.

The descriptions involved in the display device in the embodiments of the present disclosure are referred to as the embodiments shown in FIG. 4.

Figure 8:
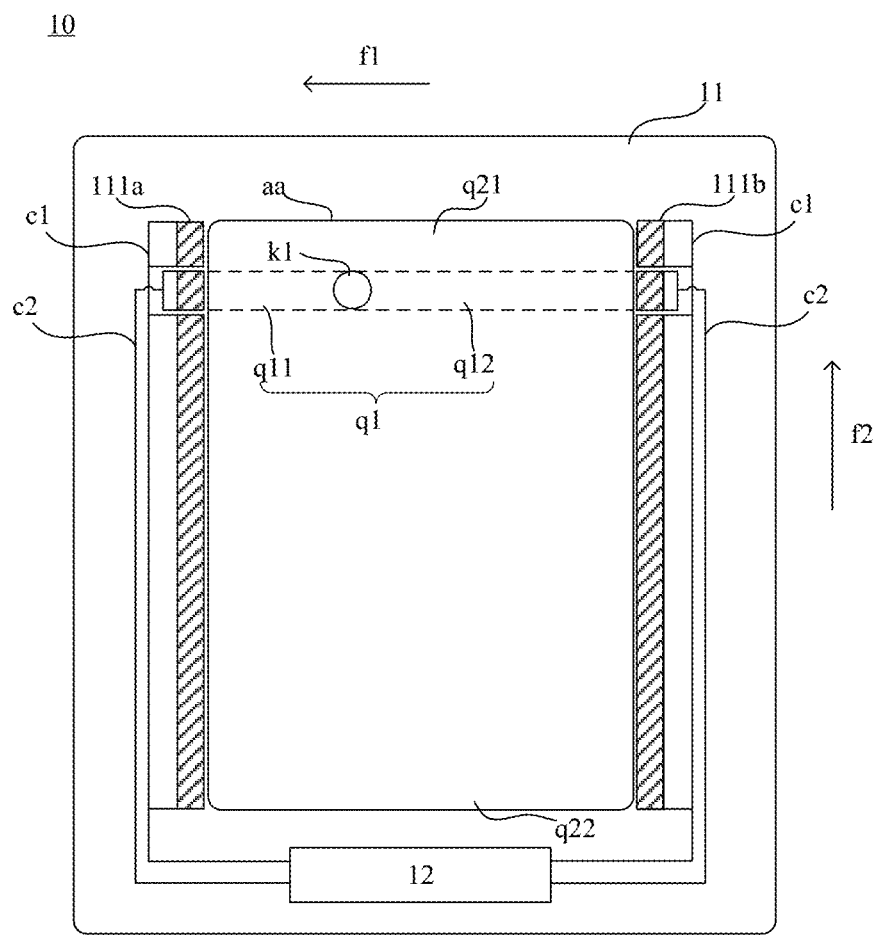
FIG. 8 is a schematic structural diagram of another display device according to some embodiments of the present disclosure.

FIG. 8 is a schematic structural diagram of another display device according to some embodiments of the present disclosure. The display device 10 is acquired by adjusting the display device shown in FIG. 1. The display panel includes a routine region clock signal line c1 and two target region clock signal lines c2, and the display region aa includes a first display region q21 and a second display region q22 that are spaced by the target region q1. The routine region clock signal line c1 is connected to the first display region q21 and the second display region q22, and the two target region clock signal lines c2 are connected to the drive circuits (the first drive circuit 111a and the second drive circuit 111b) on two sides of the target region q1.

In some embodiments, a plurality of light-emitting units arranged in columns and rows (not shown in FIG. 8) are disposed in the display region aa, and a row arrangement direction of the plurality of light-emitting units is parallel to the first direction f1.

The two target region clock signal lines c2 are respectively connected to a drive circuit corresponding to a first row of light-emitting units in the target region q1 and a drive circuit corresponding to a last row of light-emitting units in the target region q1.

The routine region clock signal line c1 is connected to a drive circuit corresponding to a first row of light-emitting units in the first display region q21 and a drive circuit corresponding to a last row of light-emitting units in the first display region q21.

The routine region clock signal line c1 is connected to a drive circuit corresponding to a first row of light-emitting units in the second display region q22 and a drive circuit corresponding to a last row of light-emitting units in the second display region q22.

The connection manner is favorable to controlling the target region q1 and other regions independently.

In some embodiments, the control assembly 12 is configured to:
control the first target region q11 on the first side and the second target region q12 on the second side based on the display control signal by the two target region clock signal lines c2, such that an on duration of a drive signal on the first target region q11 on the first side in each period is less than an on duration of a drive signal on the second target region q12 on the second side in each period; and
control the first display region q21 and the second display region q22 by the routine region clock signal line c1.

Figure 9:
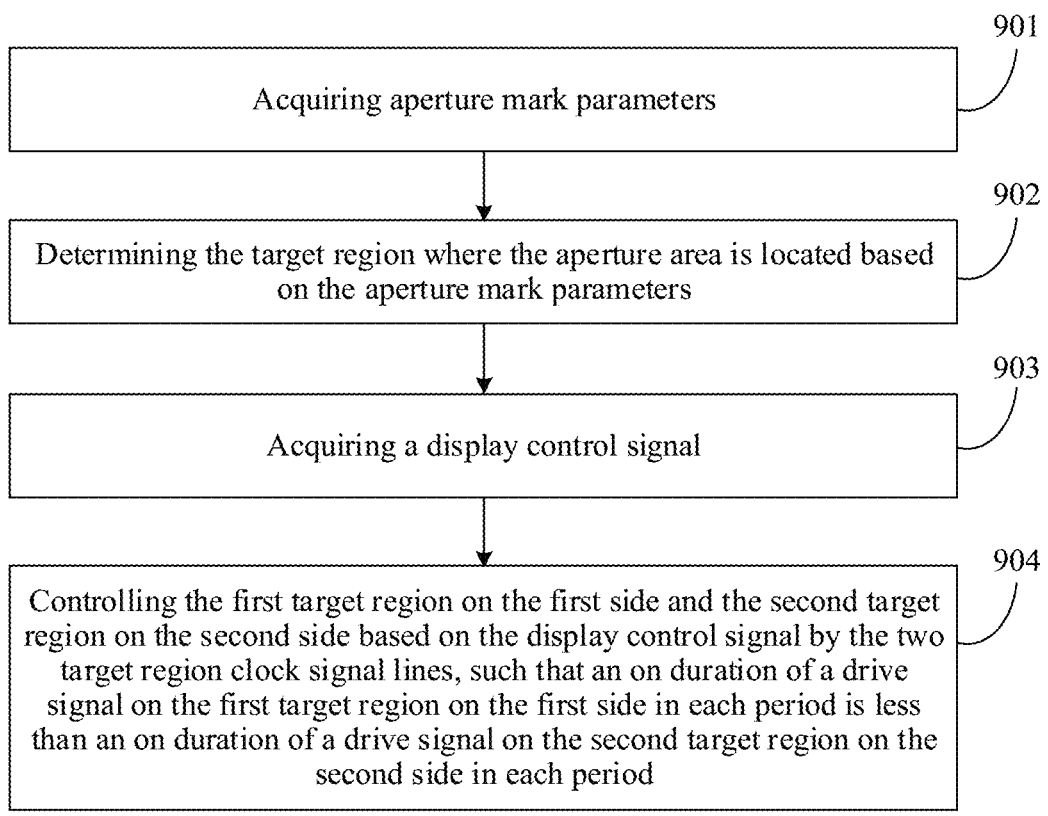
FIG. 9 is a flowchart of another method for controlling a display panel according to some embodiments of the present disclosure.

FIG. 9 is a flowchart of another method for controlling a display panel according to some embodiments of the present disclosure. The method is applicable to the control assembly of the display device shown in FIG. 8. The method for controlling the display panel includes the following processes.

In S901, aperture mark parameters are acquired.

The processes may be referred to S401 in the embodiments shown in FIG. 4, which is not repeated in the embodiments of the present disclosure.

In S902, the target region where the aperture area is located is determined based on the aperture mark parameters.

The processes may be referred to S402 in the embodiments shown in FIG. 4, which is not repeated in the embodiments of the present disclosure.

In S903, a display control signal is acquired.

The processes may be referred to S403 in the embodiments shown in FIG. 4, which is not repeated in the embodiments of the present disclosure.

In S904, the first target region on the first side and the second target region on the second side are controlled based on the display control signal by the two target region clock signal lines, such that an on duration of a drive signal on the first target region on the first side in each period is less than an on duration of a drive signal on the second target region on the second side in each period.

The control assembly independently controls the on duration of the drive signal on the target region by the target region clock signal lines. As shown in FIG. 8, the control assembly controls the on duration of the drive signal on the first target region q11 on the first side in each period and the on duration of the drive signal on the second target region q12 on the second side in each period by the two target region clock signal lines c2 shown in FIG. 8, such that the on duration of the drive signal on the first target region q11 on the first side in each period is less than the on duration of the drive signal on the second target region q12 on the second side in each period, and the difference between the luminance in the first target region on the first side and the luminance in the second target region on the second side is decreased.

Illustratively, the control assembly controls the on duration of the drive signal on the first target region q11 on the first side to be increased and/or the on duration of the drive signal on the second target region q12 on the second side to be decreased, such that the on duration of the drive signal on the first target region q11 on the first side in each period is less than the on duration of the drive signal on the second target region q12 on the second side in each period.

In addition, the descriptions of the on duration of the drive signal on the first target region q11 on the first side in each period and the on duration of the drive signal on the second target region q12 on the second side in each period may be referred to as the embodiments shown in FIG. 4, which are not repeated in the embodiments of the present disclosure.

In S905, the first display region and the second display region are controlled by the routine region clock signal line.

The control assembly controls the first display region and the second display region by the routine region clock signal line, and the controlling manner can be referred to some practices, which is not repeated in the embodiments of the present disclosure.

In summary, in the method for controlling the display panel in the embodiments of the present disclosure, by controlling drive circuits by a control assembly, the drive circuits drive, in response to different drive signals, a first target region on a first side, proximal to a first drive circuit, of the aperture area and a second target region on a second side, proximal to a second drive circuit, of the aperture area, such that a luminance difference between the first target region on the first side and the second target region on the second side is decreased. As such, in the case that the aperture area is offset, the drive signals on two sides of the aperture area are different, such that the display effect of the display panel is improved.

Figure 10:
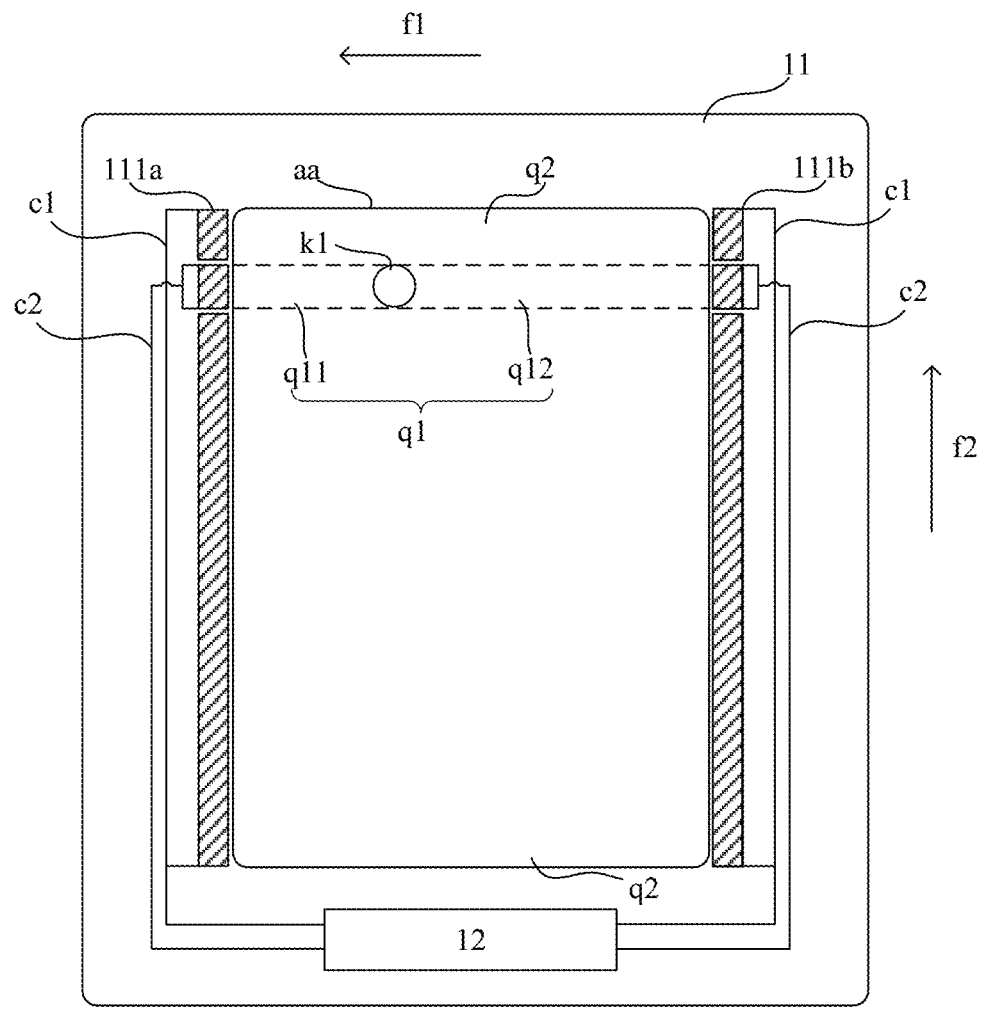
FIG. 10 is a schematic structural diagram of another display device according to some embodiments of the present disclosure.

FIG. 10 is a schematic structural diagram of another display device according to some embodiments of the present disclosure. The display device is acquired by adjusting the display device shown in FIG. 1. The display panel includes a routine region clock signal line c1 and two target region clock signal lines c2.

The routine region clock signal line c1 is connected to drive circuits (the first drive circuit 111a and the second drive circuit 111b) on two sides of a routine region in the display region aa other than the target region q1, and the two target region clock signal lines c2 are connected to the drive circuits (the first drive circuit 111a and the second drive circuit 111b) on two sides of the target region q1.

In some embodiments, a plurality of light-emitting units arranged in columns and rows (not shown in FIG. 10) are disposed in the display region aa, and a row arrangement direction of the plurality of light-emitting units is parallel to the first direction f1.

The two target region clock signal lines c2 are respectively connected to a drive circuit corresponding to a first row of light-emitting units in the target region q1 and a drive circuit corresponding to a last row of light-emitting units in the target region q1.

The routine region clock signal line c1 is connected to a drive circuit corresponding to a first row of light-emitting units in the routine region q2 and a drive circuit corresponding to a last row of light-emitting units in the routine region q2.

In this arrangement, the control assembly 12 is convenient to load an additional clock signal to the target region, such that the additional clock signal is superposed with a routine clock signal.

In some embodiments, the control assembly 12 is configured to:
input an initial clock signal to the two target region clock signal lines c2 based on the display control signal, and input an adjust clock signal to at least one of the two target region clock signal lines c2, wherein the adjust clock signal is superposed with the initial clock signal, such that an on duration of a drive signal on the first target region q11 on the first side in each period is less than an on duration of a drive signal on the second target region q12 on the second side in each period; and
control the routine region by the routine region clock signal line c1.

In some embodiments, the control assembly 12 is configured to:
acquire aperture mark parameters, wherein the aperture mark parameters record a start position and an end position of the aperture area k1 in a second region f2, and the second direction f2 is a direction perpendicular to the first direction f1; and
determine the target region q1 of the aperture area k1 based on the aperture mark parameters.

Figure 11:
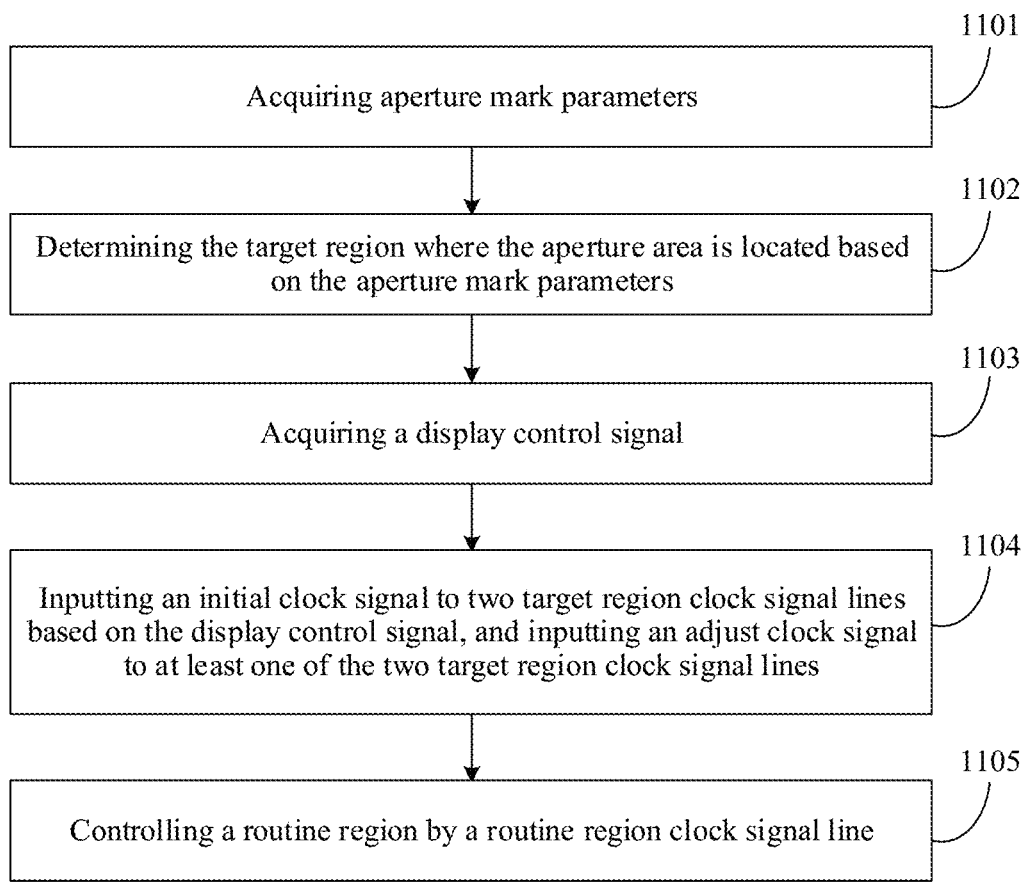
FIG. 11 is a flowchart of another method for controlling a display panel according to some embodiments of the present disclosure.

FIG. 11 is a flowchart of another method for controlling a display panel according to some embodiments of the present disclosure. The method is applicable to the control assembly of the display device shown in FIG. 10. The method for controlling the display panel includes the following processes.

In S1101, aperture mark parameters are acquired.

The processes may be referred to S401 in the embodiments shown in FIG. 4, which is not repeated in the embodiments of the present disclosure.

In S1102, the target region where the aperture area is located is determined based on the aperture mark parameters.

The processes may be referred to S402 in the embodiments shown in FIG. 4, which is not repeated in the embodiments of the present disclosure.

In S1103, a display control signal is acquired.

The processes may be referred to S403 in the embodiments shown in FIG. 4, which is not repeated in the embodiments of the present disclosure.

In S1104, an initial clock signal is input to the two target region clock signal lines based on the display control signal, and an adjust clock signal is input to at least one of the two target region clock signal lines.

The adjust clock signal is superposed with the initial clock signal, such that an on duration of a drive signal on the first target region on the first side in each period is less than an on duration of a drive signal on the second target region on the second side in each period.

The initial clock signal is a signal for controlling the drive circuits, and the initial clock signal corresponding to the first target region on the first side is the same as the initial clock signal corresponding to the second target region on the second side, such that the control assembly inputs the adjust clock signal to at least one of the two target region clock signal lines. Thus, the adjust clock signal is superposed with the initial clock signal corresponding to the first target region on the first side and/or the initial clock signal corresponding to the second target region on the second side, such that the clock signals corresponding to the target regions on two sides of the aperture area are different, and the on duration of the drive signal on the first target region on the first side in each period is less than the on duration of the drive signal on the second target region q12 on the second side in each period.

Figure 12:
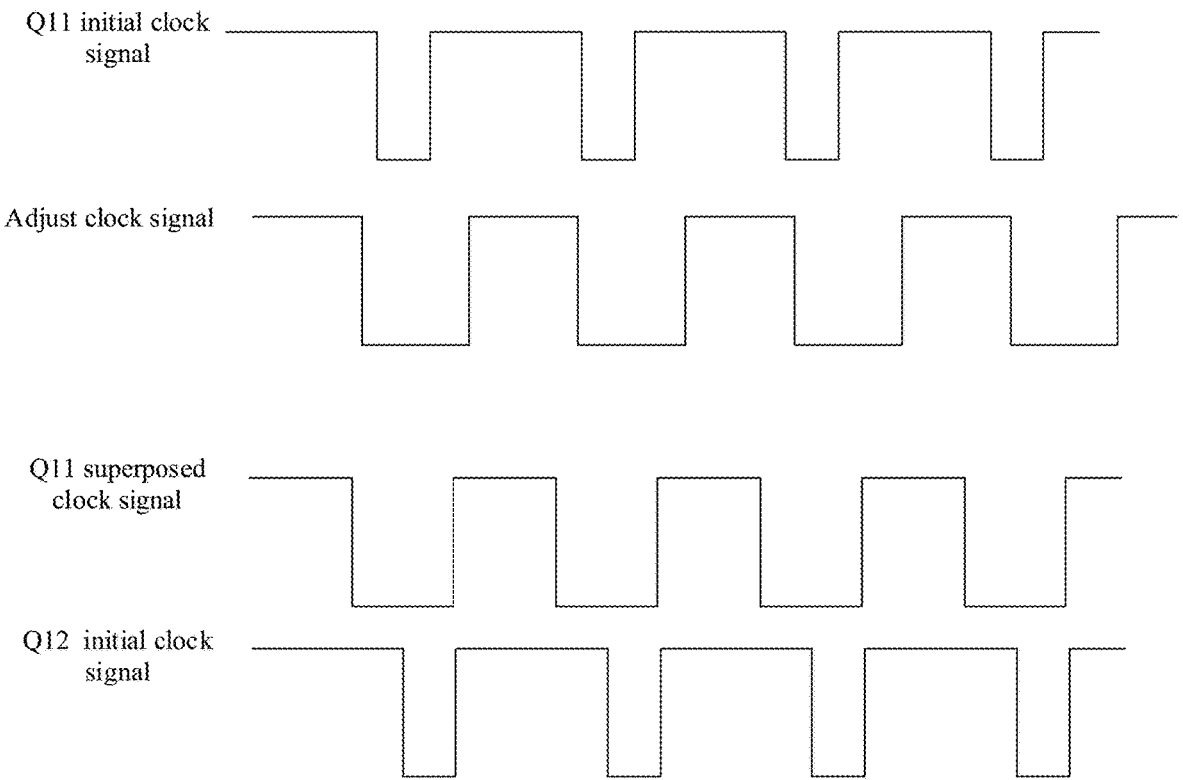
FIG. 12 is a schematic diagram of a clock signal according to some embodiments of the present disclosure.

Illustratively, as shown in FIG. 12, FIG. 12 is a schematic diagram of a clock signal according to some embodiments of the present disclosure. It can be seen from FIG. 12 that the initial clock signal corresponding to the first target region q11 on the first side is the same as the initial clock signal corresponding to the second target region q12 on the second side. Upon superposition of the initial clock signal corresponding to the first target region q11 with the adjust clock signal, an on duration of the acquired superposed clock signal in each period is less than the initial clock signal corresponding to the second target region q12 on the second side, such that the difference between the luminance in the first target region on the first side and the luminance in the second target region on the second side is decreased.

It should be noted that in the case that the control assembly simultaneously inputs the adjust clock signal to the two target region clock signal lines, the control assembly inputs different adjust clock signals to the two target region clock signal lines, such that the clock signals corresponding to the target regions on two sides of the aperture area are different.

The adjust clock signal is determined by simulation or experiments, and the determined adjust clock signal is stored in the control assembly.

In S1105, the routine region is controlled by the routine region clock signal line.

The control assembly controls the routine region by the routine region clock signal line, and the controlling manner can be referred to some practices, which is not repeated in the embodiments of the present disclosure.

In summary, in the method for controlling the display panel in the embodiments of the present disclosure, by controlling drive circuits by a control assembly, the drive circuits drive, in response to different drive signals, a first target region on a first side, proximal to a first drive circuit, of the aperture area and a second target region on a second side, proximal to a second drive circuit, of the aperture area, such that a luminance difference between the first target region on the first side and the second target region on the second side is decreased. As such, in the case that the aperture area is offset, the drive signals on two sides of the aperture area are different, such that the display effect of the display device is improved.

The following is the embodiments of the apparatus applicable to implementing the embodiments of the method, and details not described in the embodiments of the apparatus can be referred to the embodiments of the method.

Figure 13:
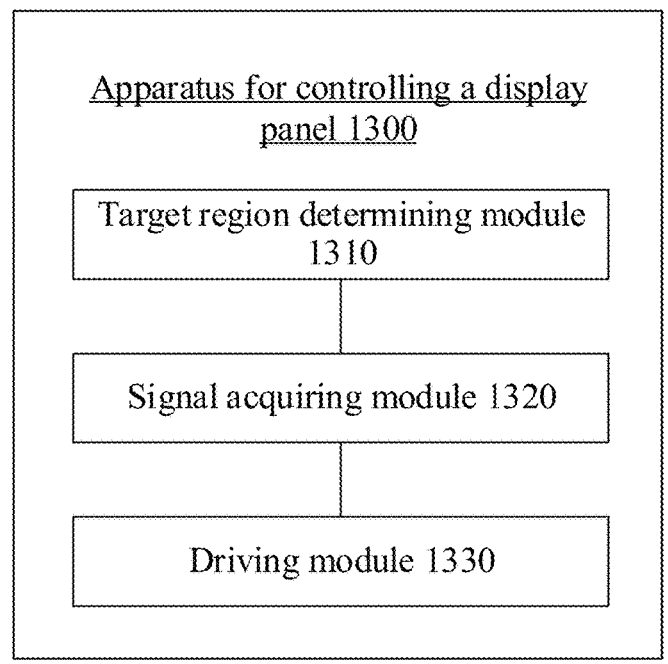
FIG. 13 is a block diagram of an apparatus for controlling a display panel according to some embodiments of the present disclosure.

FIG. 13 is a block diagram of an apparatus for controlling a display panel according to some embodiments of the present disclosure. The apparatus for controlling the display panel is partially or all integrated with the control assembly of the display device in the above embodiments. The apparatus 1300 for controlling the display panel includes:

a target region determining module 1310, configured to determine a target region where the aperture area is located, wherein the target region is a part of the display region including the aperture area in a first direction, the first direction being an arrangement direction of the first drive circuit and the second drive circuit;

a signal acquiring module 1320, configured to acquire a display control signal; and a driving module 1330, configured to control the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased.

In summary, in the apparatus for controlling the display panel in the embodiments of the present disclosure, by controlling drive circuits by a control assembly, the drive circuits drive, in response to different drive signals, a first target region on a first side, proximal to the first drive circuit, of the aperture area and a second target region on a second side, proximal to a second drive circuit, of the aperture area, such that a luminance difference between the first target region on the first side and the second target region on the second side is decreased. As such, in the case that the aperture area is offset, the drive signals on two sides of the aperture area are different, such that the display effect of the display device is improved.

In some embodiments, the driving module is configured to:
control the drive circuits based on the display control signal, such that a drive signal on the first target region on the first side is greater than a drive signal on the second target region on the second side.

In some embodiments, the driving module is configured to:
control the drive circuits based on the display control signal, such that an on duration of a drive signal on the first target region on the first side in each period is less than an on duration of a drive signal on the second target region on the second side in each period.

Embodiments of the present disclosure further provide display apparatus. The display apparatus includes: a processor, a memory storing at least one instruction, at least one program, a code set, or an instruction set therein, and a display panel. The processor, when loading and executing the at least one instruction, the at least one program, the code set, or the instruction set, is caused to perform the above method for controlling the display panel.

Embodiments of the present disclosure further provide a non-transitory computer storage medium. The computer storage medium stores at least one instruction, at least one program, a code set, or an instruction set. The at least one instruction, the at least one program, the code set, or the instruction set, when loaded and executed by a processor, causes the processor to perform the above method for controlling the display panel.

In the present disclosure, the term "and/or" describes associations between associated objects, and indicates three types of relationships. For example, "A and/or B" indicates that A alone, A and B, or B alone. In addition, the forward-slash symbol "/" generally indicates that the associated objects are in an "or" relationship.

In the present disclosure, the term "at least one of A and B" describes associations between associated objects, and indicates three types of relationships. For example, the term "at least one of A and B" indicates that A alone, A and B, or B alone. Similarly, the term "at least one of A, B and C" indicates seven types of relationships, that is, A alone, B alone, C alone, A and B, A and C, C and B, and A, B and C. Similarly, the term "at least one of A, B, C and D" indicates fifteen types of relationships, that is, A alone, B alone, C alone, D alone, A and B, A and C, A and D, C and B, D and B, C and D, A, B and C, A, B and D, A, C and D, B, C and D, and A, B, C and D.

In the present disclosure, the terms "first," "second," "third," "fourth," and the like are only used for the purpose of description and should not be construed as indicating or implying relative importance or implicitly indicating the number of technical features as indicated. Unless otherwise clearly defined, the expression "a plurality of" refers to two or more.

In the embodiments of the present disclosure, it should be noted that the device and method may be achieved in other manners. For example, the above embodiments of the device are merely illustrative. For example, the division of the units are the division based on logical functions, and other divisions may be performed in actual implementation. For example, a plurality of units or assemblies are combined or integrated on another system, or some features are omitted or not performed. In addition, the coupling, the direct coupling, or the communication connection displayed or described in the above description are achieved by interfaces, and the indirect coupling or communication connection between the devices or units are electrical, mechanical, or in other manners.

The units described as separated members are or are not separated physically. The members displayed as the units are or are not physical units, that is, are in a same position or disposed on a grid unit. Some or all units are selected to achieved the technical effects of the embodiments of the present disclosure based on actual needs.

Persons of ordinary skill in the art should understand that some or all of the processes in the above embodiments can be achieved by the hardware or by the hardware instructed by the programs. The programs are stored in a computer-readable storage medium, and the above storage medium are a read only memory, a disk, or an optical disc.

Described above are example embodiments of the present disclosure, and are not intended to limit the present disclosure. Any modifications, equivalent replacements, improvements and the like made within the spirit and principles of the present disclosure should be included within the scope of protection of the present disclosure.

The invention claimed is:

1. A display device, comprising: a control assembly and a display panel; wherein
the display panel comprises a display region and drive circuits, wherein the drive circuits comprise a first drive circuit and a second drive circuit that are respectively disposed on two sides of the display region, and an aperture area is defined in the display region, wherein a distance between the aperture area and the first drive circuit is less than a distance between the aperture area and the second drive circuit; and the control assembly is connected to the display panel, and configured to:

determine a target region where the aperture area is located, wherein the target region is a part of the display region comprising the aperture area in a first direction, the first direction being an arrangement direction of the first drive circuit and the second drive circuit;

acquire a display control signal; and control the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased, wherein the display panel comprises a routine region clock signal line and two target region clock signal lines, and the display region comprises a first display region and a second display region that are spaced by the target region, wherein the routine region clock signal line is connected to the first display region and the second display region, and the two target region clock signal lines are connected to the drive circuits on two sides of the target region; and the control assembly is configured to:

control the first target region on the first side and the second target region on the second side based on the display control signal by the two target region clock signal lines, such that an on duration of a drive signal on the first target region on the first side in each period is less than an on duration of a drive signal on the second target region on the second side in each period; and control the first display region and the second display region by the routine region clock signal line.

2. The display device according to claim 1, wherein the control assembly is configured to control the drive circuits based on the display control signal, such that a strength of a drive signal on the first target region on the first side is greater than a strength of a drive signal on the second target region on the second side.

3. The display device according to claim 2, wherein the control assembly is configured to control the drive circuits based on the display control signal, such that at least one of following conditions is met: the strength of the drive signal on the first target region on the first side being increased, or the strength of the drive signal on the second target region on the second side being decreased.

4. The display device according to claim 2, wherein the first target region on the first side comprises a plurality of first sub-regions, and strengths of drive signals on the plurality of first sub-regions are positively correlated with distances between the plurality of first sub-regions and the first drive circuit; and the second target region on the second side comprises a plurality of second sub-regions, and strengths of drive signals on the plurality of second sub-regions are positively correlated with distances between the plurality of second sub-regions and the second drive circuit.

5. The display device according to claim 1, wherein the control assembly is configured to control the drive circuits based on the display control signal, such that an on duration of a drive signal on the first target region on the first side in each period is less than an on duration of a drive signal on the second target region on the second side in each period.

6. The display device according to claim 5, wherein the control assembly is configured to control the drive circuits based on the display control signal, such that at least one of following conditions is met: the on duration of the drive signal on the first target region on the first side being increased, or the on duration of the drive signal on the second target region on the second side being decreased.

7. The display device according to claim 1, wherein the control assembly is configured to control the drive circuits based on the display control signal, such that a strength of a drive signal on the first target region on the first side is greater than a strength of a drive signal on the second target region on the second side, and an on duration of the drive signal on the first target region on the first side in each period is less than an on duration of the drive signal on the second target region on the second side in each period.

8. The display device according to claim 1, wherein a plurality of light-emitting units arranged in columns and rows are disposed in the display region, and a row arrangement direction of the plurality of light-emitting units is parallel to the first direction; wherein the two target region clock signal lines are respectively connected to a drive circuit corresponding to a first row of light-emitting units in the target region and a drive circuit corresponding to a last row of light-emitting units in the target region;

the routine region clock signal line is connected to a drive circuit corresponding to a first row of light-emitting units in the first display region and a drive circuit corresponding to a last row of light-emitting units in the first display region, and the routine region clock signal line is connected to a drive circuit corresponding to a first row of light-emitting units in the second display region and a drive circuit corresponding to a last row of light-emitting units in the second display region.

9. The display device according to claim 1, wherein the display panel comprises a routine region clock signal line and two target region clock signal lines, wherein the routine region clock signal line is connected to drive circuits on two sides of a routine region in the display region other than the target region, and the two target region clock signal lines are connected to the drive circuits on two sides of the target region; and the control assembly is further configured to:

input an initial clock signal to the two target region clock signal lines based on the display control signal, and input an adjust clock signal to at least one of the two target region clock signal lines, wherein the adjust clock signal is superposed with the initial clock signal, such that an on duration of a drive signal on the first target region on the first side in each period is less than an on duration of a drive signal on the second target region on the second side in each period; and control the routine region by the routine region clock signal line.

10. The display device according to claim 9, wherein a plurality of light-emitting units arranged in columns and rows are disposed in the display region, and a row arrangement direction of the plurality of light-emitting units is parallel to the first direction; wherein the two target region clock signal lines are respectively connected to a drive circuit corresponding to a first row of light-emitting units in the target region and a drive circuit corresponding to a last row of light-emitting units in the target region; and the routine region clock signal line is connected to a drive circuit corresponding to a first row of light-emitting units in the routine region and a drive circuit corresponding to a last row of light-emitting units in the routine region.

11. The display device according to claim 1, wherein the control assembly is configured to:

acquire aperture mark parameters, wherein the aperture mark parameters record a start position and an end position of the aperture area in a second region, the second direction being a direction perpendicular to the first direction; and determine the target region where the aperture area is located based on the aperture mark parameters.

12. A method for controlling a display panel, applicable to controlling the display panel, the display panel comprising a display region and drive circuits, wherein the drive circuits comprise a first drive circuit and a second drive circuit that are respectively disposed on two sides of the display region, and an aperture area is defined in the display region, wherein a distance between the aperture area and the first drive circuit is less than a distance between the aperture area and the second drive circuit; and the method comprising:

determining a target region where the aperture area is located, wherein the target region is a part of the display region comprising the aperture area in a first direction, the first direction being an arrangement direction of the first drive circuit and the second drive circuit;

acquiring a display control signal; and controlling the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased, wherein the display panel comprises a routine region clock signal line and two target region clock signal lines, and the display region comprises a first display region and a second display region that are spaced by the target region, wherein the routine region clock signal line is connected to the first display region and the second display region, and the two target region clock signal lines are connected to the drive circuits on two sides of the target region; and controlling the drive circuits based on the display control signal to drive, in response to the different drive signals, the first target region on the first side, proximal to the first drive circuit, of the aperture area and the second target region on the second side, proximal to the second drive circuit, of the aperture area comprises:

controlling the first target region on the first side and the second target region on the second side based on the display control signal by the two target region clock signal lines, such that an on duration of a drive signal on the first target region on the first side in each period is less than an on duration of a drive signal on the second target region on the second side in each period; and controlling the first display region and the second display region by the routine region clock signal line.

13. The method according to claim 12, wherein controlling the drive circuits based on the display control signal to drive, in response to the different drive signals, the first target region on the first side, proximal to the first drive circuit, of the aperture area and the second target region on the second side, proximal to the second drive circuit, of the aperture area comprises:

controlling the drive circuits based on the display control signal, such that a strength of a drive signal on the first target region on the first side is greater than a strength of a drive signal on the second target region on the second side.

14. The method according to claim 12, wherein controlling the drive circuits based on the display control signal to drive, in response to the different drive signals, the first target region on the first side, proximal to the first drive circuit, of the aperture area and the second target region on the second side, proximal to the second drive circuit, of the aperture area comprises:

controlling the drive circuits based on the display control signal, such that an on duration of a drive signal on the first target region on the first side in each period is less than an on duration of a drive signal on the second target region on the second side in each period.

15. The method according to claim 12, wherein the display panel comprises a routine region clock signal line and two target region clock signal lines, wherein the routine region clock signal line is connected to drive circuits on two sides of a routine region in the display region other than the target region, and the two target region clock signal lines are connected to the drive circuits on two sides of the target region; and controlling the drive circuits based on the display control signal to drive, in response to the different drive signals, the first target region on the first side, proximal to the first drive circuit, of the aperture area and the second target region on the second side, proximal to the second drive circuit, of the aperture area comprises:

inputting an initial clock signal to the two target region clock signal lines based on the display control signal, and inputting an adjust clock signal to at least one of the two target region clock signal lines, wherein the adjust clock signal is superposed with the initial clock signal, such that an on duration of a drive signal on the first target region on the first side in each period is less than an on duration of a drive signal on the second target region on the second side in each period; and controlling the routine region by the routine region clock signal line.

16. A non-transitory computer storage medium, storing at least one instruction, at least one program, a code set, or an instruction set; wherein the at least one instruction, the at least one program, the code set, or the instruction set, when loaded and executed by a processor, causes the processor to perform the method for controlling the display panel as defined in claim 12.

17. A display apparatus, comprising: a processor, a memory storing at least one instruction, at least one program, a code set, or an instruction set therein, and a display panel; wherein the processor, when loading and executing the at least one instruction, the at least one program, the code set, or the instruction set, is caused to:

determine a target region where the aperture area is located, wherein the target region is a part of the display region comprising the aperture area in a first direction, the first direction being an arrangement direction of the first drive circuit and the second drive circuit;

acquire a display control signal; and control the drive circuits based on the display control signal to drive, in response to different drive signals, a first target region on a first side, proximal to the first drive circuit, of the aperture area and a second target region on a second side, proximal to the second drive circuit, of the aperture area, such that a luminance difference between the first target region on the first side and the second target region on the second side is decreased, wherein the display panel comprises a routine region clock signal line and two target region clock signal lines, and the display region comprises a first display region and a second display region that are spaced by the target region, wherein the routine region clock signal line is connected to the first display region and the second display region, and the two target region clock signal lines are connected to the drive circuits on two sides of the target region; and control the drive circuits based on the display control signal to drive, in response to the different drive signals, the first target region on the first side, proximal to the first drive circuit, of the aperture area and the second target region on the second side, proximal to the second drive circuit, of the aperture area comprises:

control the first target region on the first side and the second target region on the second side based on the display control signal by the two target region clock signal lines, such that an on duration of a drive signal on the first target region on the first side in each period is less than an on duration of a drive signal on the second target region on the second side in each period; and control the first display region and the second display region by the routine region clock signal line.

18. The display apparatus according to claim 17, wherein the processor, when loading and executing the at least one instruction, the at least one program, the code set, or the instruction set, is caused to:

control the drive circuits based on the display control signal, such that a strength of a drive signal on the first target region on the first side is greater than a strength of a drive signal on the second target region on the second side.

* * * * *